United States Patent
Lu et al.

(10) Patent No.: US 7,183,494 B2
(45) Date of Patent: Feb. 27, 2007

(54) BONDING STRUCTURE WITH BUFFER LAYER AND METHOD OF FORMING THE SAME

(75) Inventors: Su-Tsai Lu, Miaoli Hsien (TW); Shu-Ming Chang, Tucheng (TW); Shyh-Ming Chang, Hsinchu (TW); Yao-Sheng Lin, West District Chiayi (TW); Yuan-Chang Huang, Banciao (TW)

(73) Assignee: Industrial Technology Research Institute, Hsinchu (TW)

( * ) Notice: Subject to any disclaimer, the term of this patent is extended or adjusted under 35 U.S.C. 154(b) by 340 days.

(21) Appl. No.: 10/829,060

(22) Filed: Apr. 20, 2004

(65) Prior Publication Data

US 2005/0112340 A1    May 26, 2005

(30) Foreign Application Priority Data

Nov. 24, 2003   (TW) .............................. 92132948 A

(51) Int. Cl.
*H05K 1/02*    (2006.01)
(52) U.S. Cl. ...................... 174/259; 174/256; 361/790; 257/E23.021; 257/781; 257/782; 257/783; 257/786; 438/613; 438/614; 438/615; 438/616; 438/617
(58) Field of Classification Search ................. 174/256, 174/259
See application file for complete search history.

(56) References Cited

U.S. PATENT DOCUMENTS

| | | | | |
|---|---|---|---|---|
| 5,407,506 A | | 4/1995 | Goetz et al. ............... 156/153 |
| 5,427,638 A | | 6/1995 | Goetz et al. ................ 156/153 |
| 5,714,252 A | * | 2/1998 | Hogerton et al. ........... 428/344 |
| 5,889,326 A | * | 3/1999 | Tanaka ........................ 257/737 |
| 6,309,737 B1 | * | 10/2001 | Hirashima et al. .......... 428/210 |
| 6,333,104 B1 | * | 12/2001 | Perry et al. ................. 428/328 |
| 6,337,522 B1 | * | 1/2002 | Kang et al. .................. 257/784 |
| 6,373,714 B1 | * | 4/2002 | Kudoh et al. ............... 361/760 |
| 6,586,322 B1 | * | 7/2003 | Chiu et al. .................. 438/612 |
| 6,618,269 B2 | * | 9/2003 | Chen ........................... 361/793 |
| 6,739,027 B1 | * | 5/2004 | Lauffer et al. ............. 29/25.42 |
| 6,740,823 B2 | * | 5/2004 | Shimizu ...................... 174/260 |
| 6,744,142 B2 | * | 6/2004 | Liu et al. ..................... 257/778 |
| 6,858,111 B2 | * | 2/2005 | Perry et al. .................. 156/327 |
| 6,872,984 B1 | * | 3/2005 | Leung .......................... 257/81 |
| 7,069,645 B2 | * | 7/2006 | Ishikawa et al. .............. 29/830 |
| 2003/0005582 A1 | * | 1/2003 | Tatoh et al. ................... 29/832 |

* cited by examiner

*Primary Examiner*—Dean A. Reichard
*Assistant Examiner*—Hoa C. Nguyen

(57) ABSTRACT

A bonding structure with a buffer layer, and a method of forming the same are provided. The bonding structure comprises a first substrate with metal pads thereon, a protection layer covered on the surface of the substrate, a first adhesive metal layer formed on the metal pads, a buffer layer coated on the protection layer and the metal pads, a first metal layer covered on the buffer layer, and a second substrate with electrodes and a bonding layer thereon. The first metal layer, the electrodes and the bonding layer are bonded to form the bonding structure. Direct bonding can be performed through surface activation or heat pressure. The method uses fewer steps and is more reliable. The temperature required for bonding the structure is lower. The bonding density between the contacted surfaces is increased to a fine pitch. The quality at the bonding points is increased because fewer contaminations between the contacted surfaces are generated.

14 Claims, 13 Drawing Sheets

BONDING STRUCTURE WITH BUFFER LAYER AND METHOD OF FORMING THE SAME

FIELD OF THE INVENTION

The present invention generally relates to a bonding structure for bonding semiconductor material or metal surface to substrate, and a method of forming the same, and more specifically to a bonding structure with a buffer layer, and a method of forming the same. The bonding structure can be applied to bond integrated circuit (IC) or chip to substrate.

BACKGROUND OF THE INVENTION

There are a variety of conventional bonding techniques for bonding semiconductor material or metal surface to substrate. One of them is the anisotropic conductive film (ACF) bonding technique. The ACF bonding technique places a layer of anisotropic conductive film containing conductive particles between chip and the device to be bonded, and bonds the chip and the device together by melting the anisotropic conductive film using heat and pressure. It also forms conductive channel by using metal pads, metal bumps and conductive particles. The disadvantage of this technique is that it can not meet finer pitch requirement. For a finer pitch between the metal pads and the metal bumps, conductive particles will flow because of heat and pressure being applied. Thereby two adjacent conductive points may be short. Thus, the technique can not meet finer pitch requirement. The bonding density of this ACF bonding technique can only reach to as small as 50 μm pitch.

Another conventional bonding technique is using non-conductive film (NCF) for bonding. The difference between the NCF bonding technique and the ACF bonding technique is that the former does not contain any conductive particle in the adhesive material. The bonding structure using this NCF bonding technique uses heat and pressure to melt the non-conductive film. After the non-conductive film has consolidated, the generated contractive stress bonds the chip and the device together. Although the bonding density is high for this NCF bonding technique, the bonding of the chip and the device is maintained only by mechanical force. That is, the contractive stress generated by the film has to maintain the conducting quality of the contact points. Once the film bears too much stress, the contact surface among the film, integrated circuit and substrate will produce lamination and increase the resistance after bonding.

Another method is Au—Au diffusion bonding technique. Because its bonding temperature is too high and metal oxides will be formed on the surfaces of metal layers, covalent bonds will limit free electrons of metal. Therefore, it is hard to form metal bonds between two bonding surfaces. Also, the electrical conductivity comes from tunnel-through effect that generates higher contact impedance. Therefore, it is not suitable to fine pitch applications too.

U.S. Pat. Nos. 5,407,506 and 5,427,638 disclose respectively surface activation methods. The surface activation methods disclosed in these U.S. patents mainly bombard the polished surfaces and the cleaned surfaces by oxygen ions, fluorine ions, or their mixture to activate these surfaces. Then particles on these activated surfaces are removed and these activated surfaces are contacted under room temperature to complete the activation bonding.

SUMMARY OF THE INVENTION

The present invention has been made to overcome the above-mentioned drawback of conventional bonding methods that need high bonding temperature and to increase the bonding density and the quality of bonding surfaces. The primary object of the present invention is to provide a bonding structure with a buffer layer, and a method of forming the same. The bonding method of the invention combines Au—Au diffusion bonding technology to perform direct bonding with surfaces. Using such a buffer layer, it creates a new bonding structure and its process uses fewer steps and is more reliable.

The bonding structure of the invention comprises mainly a first substrate with metal pads thereon, a protection layer, a first adhesive metal layer, a buffer layer, a first metal layer and a second substrate. The protection layer is covered on a surface of the first substrate, the first adhesive metal layer is formed on the metal pads, the buffer layer is coated on the protection layer and the metal pads, and the first metal layer is covered on the buffer layer. A surface of the second substrate has independently distributed electrodes and a bonding layer thereon. The first metal layer, the electrodes and the bonding layer are bonded together to complete the bonding structure.

There are two preferred embodiments of the bonding structure according to the present invention. In the first preferred embodiment, the buffer layer coated on metal pads and the buffer layer coated on the protection layer are independently distributed. In the second preferred embodiment, the buffer layer coated on metal pads and the buffer layer coated on the protection layer are connected. In both preferred embodiments, the electric connection between the first adhesive metal layer and the first metal layer can have various structures to implement.

Using the bonding structure of the present invention, the bonding process uses fewer steps than the conventional surface activation method. The bonding process of the invention mainly comprises two steps. First, a bonding structure with a buffer layer is formed. Then the surface of the first metal layer, the bonding layer on the second substrate and the surface of metal pads are directly bonded together. Because the bonding process uses fewer steps, it is more reliable. After completing the bonding structure, under-fill can be applied to increase the reliability of the bonding structure.

The direct bonding can be performed through surface activation, surface activation plus heat pressure, or heat pressure only.

The bonding method of the invention requires lower bonding temperature. Therefore, it resolves the drawback of conventional bonding methods that need high bonding temperature. The bonding density between the contacted surfaces is increased to a fine pitch. The quality at the bonding points is increased because fewer contaminations between the contacted surfaces are generated. The bonding structure and the bonding method of the invention can be applied to bond integrated circuit or chip to substrate.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
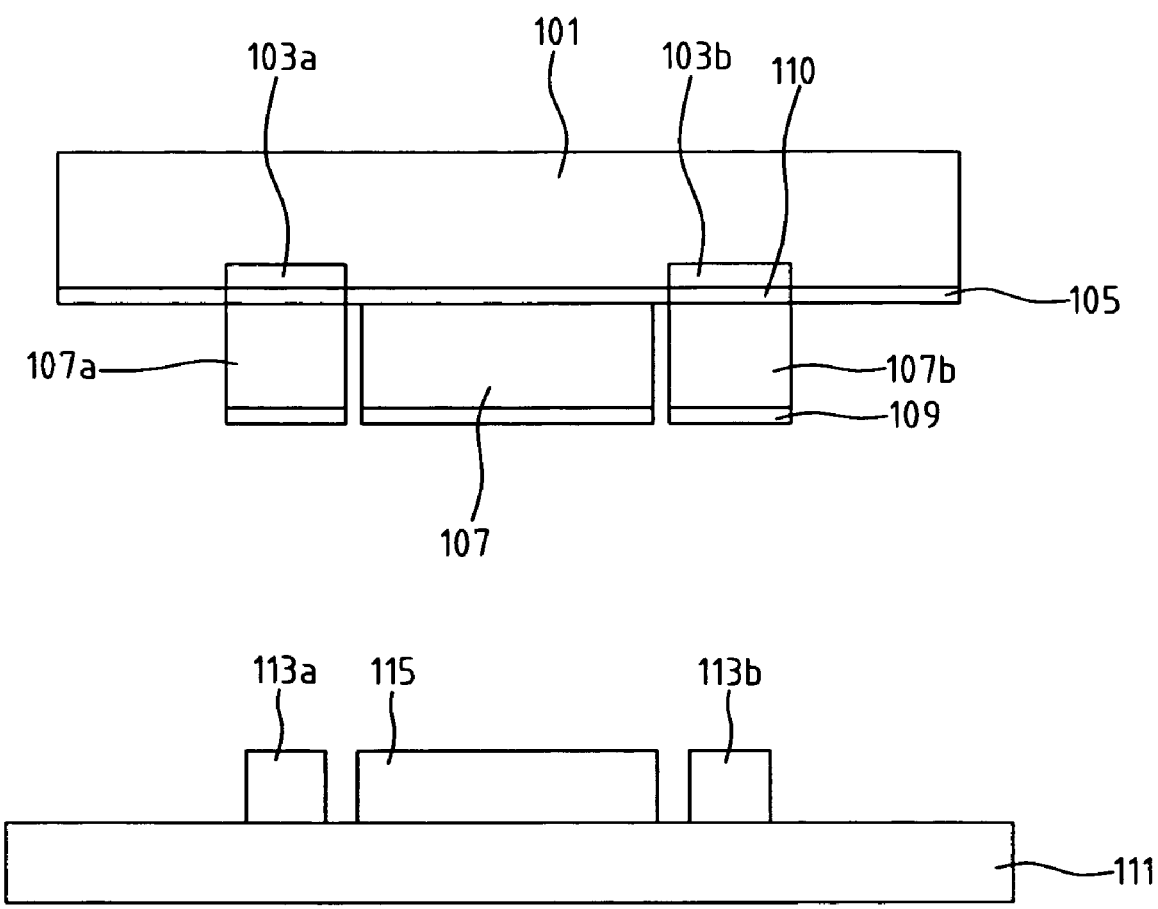
FIG. 1 shows a cross-sectional view of the bonding structure with a buffer layer before bonding according to the invention.

FIG. 1 shows a cross-sectional view of the bonding structure with a buffer layer before bonding according to the invention. In this embodiment, there are metal pads 103a and 103b on a surface of the first substrate 101 shown in the upper figure of FIG. 1. A protection layer 105 is covered on that surface of the first substrate 101. A first adhesive metal layer 110 is formed on the metal pads 103a and 103b. Buffer layers 107, 107a and 107b are respectively coated on the protection layer 105 and the first adhesive metal layer 110 over the metal pads 103a and 103b. A first metal layer 109 covers buffer layers 107, 107a and 107b.

Metal pads 103a and 103b are used as conducting circuit for the first substrate 101. They can be made of aluminum (Al) or copper (Cu). The protection layer 105 protects the integrated circuit on the first substrate 101. The first substrate can be a silicon (Si) substrate. The material for the buffer layer can be polyimide. The material for the first metal layer can be chosen from one of gold (Au), aluminum or copper. It is worthy to mention that the buffer layer coated on the first adhesive metal layer over the metal pads and the buffer layer on the protection layer are independently distributed in the embodiment.

The lower figure of FIG. 1 illustrates the elements bonding to the upper figure. As shown in the lower figure, the bonding elements include a second substrate 111, electrodes 113a and 113b on the second substrate 111, and a bonding layer 115. The bonding layer 115 and electrodes 113a and 113b are independently distributed on the second substrate 111.

Electrodes 113a and 113b on the second substrate 111 are aligned respectively to metal pads 103a and 103b on the surface of the first substrate 101. The second substrate 111 is generally a glass substrate or a substrate made of polymer or ceramic.

Figure 2:
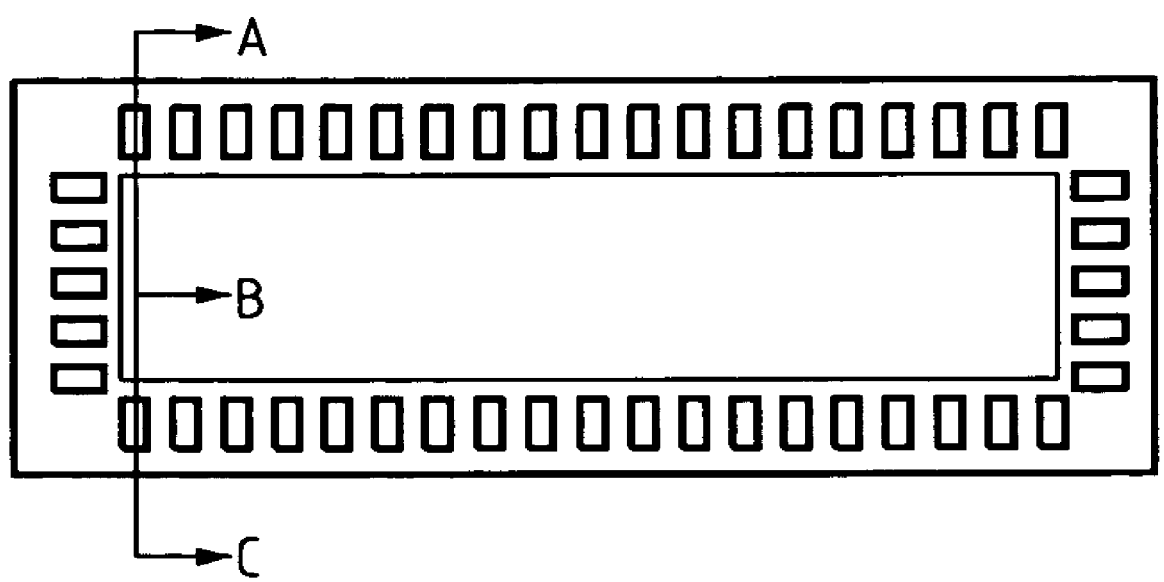
FIG. 2 shows a top view of the structure shown in FIG. 1.

FIG. 2 shows a top view of the structure shown in FIG. 1. FIG. 1 is an A-C cross-sectional view of FIG. 2.

Figure 3A:
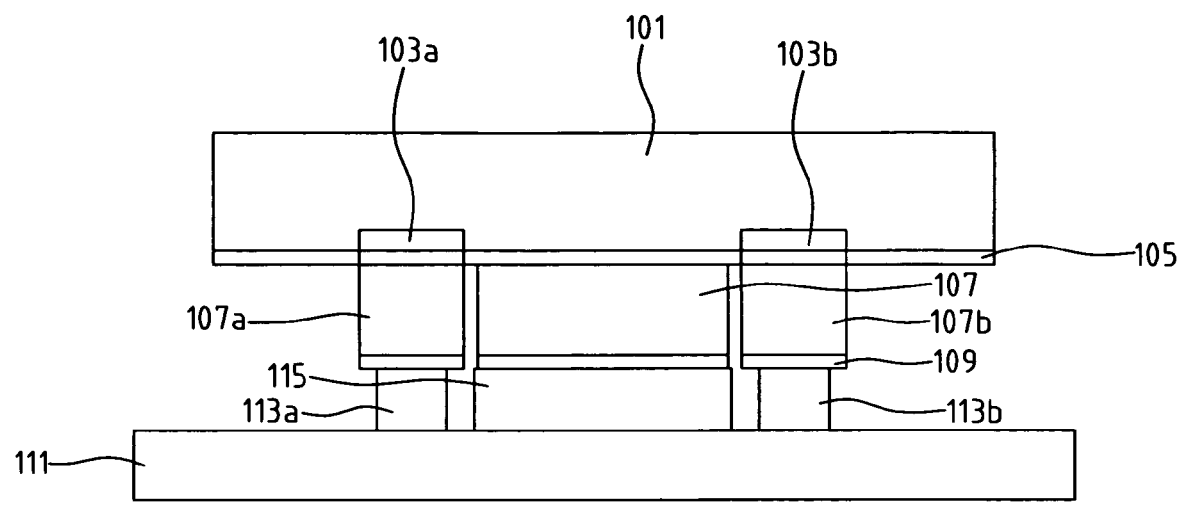
FIGS. 3a and 3b show respectively cross-sectional views of the bonding structure without and with under-fill after bonding the structures shown in the upper and the lower figures of FIG. 1.
Figure 3B:
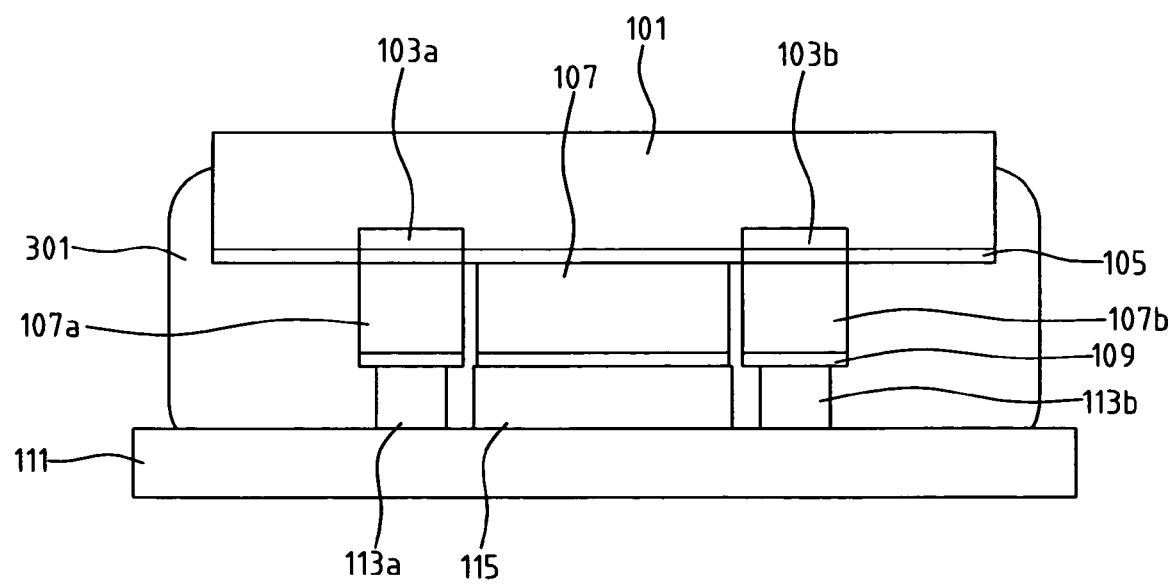

Referring to the upper and the lower figures of FIG. 1, the first metal layer 109, electrodes 113a and 113b and the bonding layer 115 are bonded directly to complete the bonding structure. FIGS. 3a and 3b show respectively cross-sectional views of the bonding structure without and with under-fill after bonding the structures shown in the upper and the lower figures of FIG. 1. Label 301 in FIG. 3b shows the region of under-fill.

Figure 4:
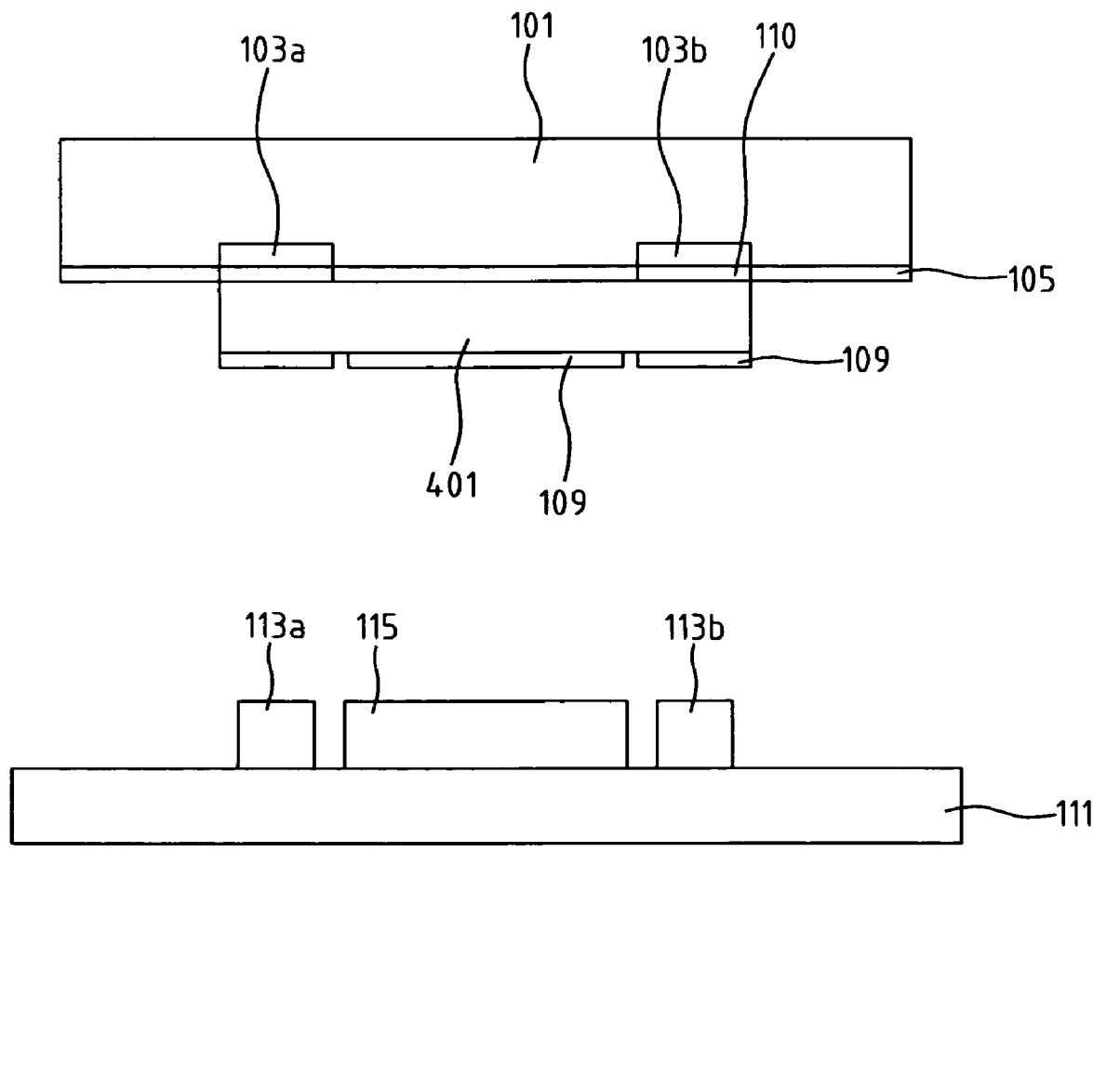
FIG. 4 illustrates another cross-sectional view of the bonding structure with a buffer layer before bonding according to the invention.

FIG. 4 illustrates another cross-sectional view of the bonding structure with a buffer layer before bonding according to the invention. The difference between this embodiment and the embodiment illustrated in FIG. 1 is that the buffer layer coated on the first adhesive metal layer over the metal pads and the buffer layer on the protection layer are connected, as shown in label 401 of FIG. 4.

Figure 5:
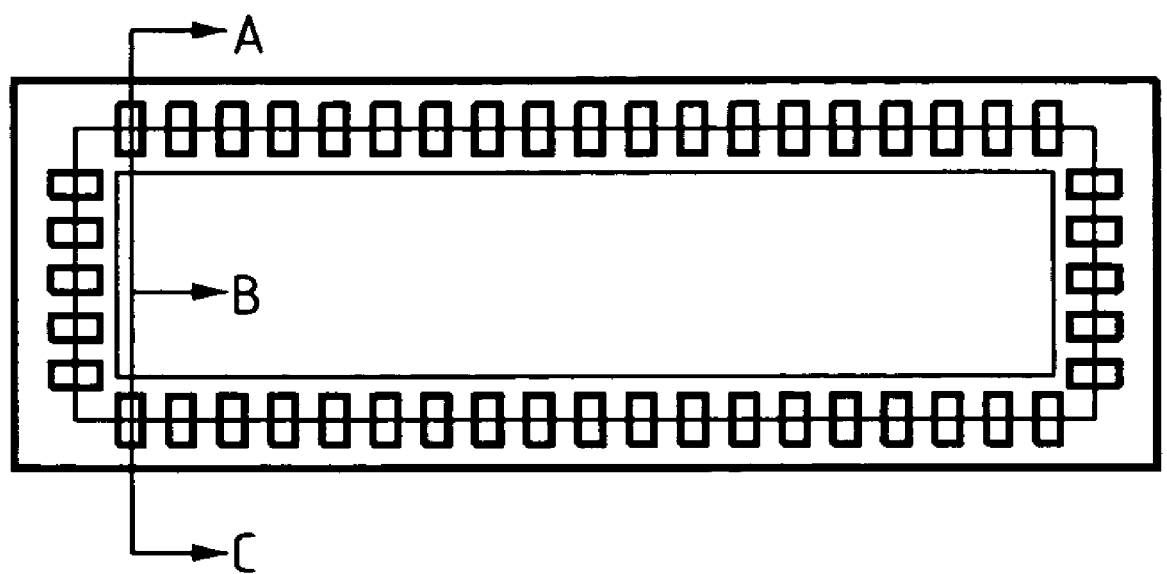
FIG. 5 shows a top view of the structure illustrated in FIG. 4.

FIG. 5 shows a top view of the structure illustrated in FIG. 4. FIG. 4 is an A-C cross-sectional view of FIG. 5.

Figure 6A:
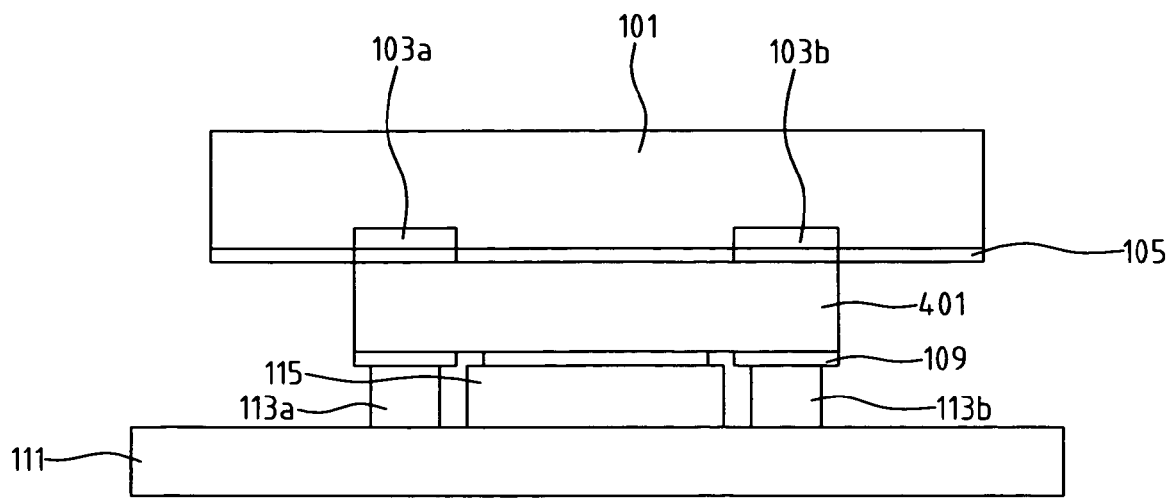
FIGS. 6a and 6b show respectively cross-sectional views of the bonding structure without and with under-fill after bonding the structures shown in the upper and the lower figures of FIG. 3.
Figure 6B:
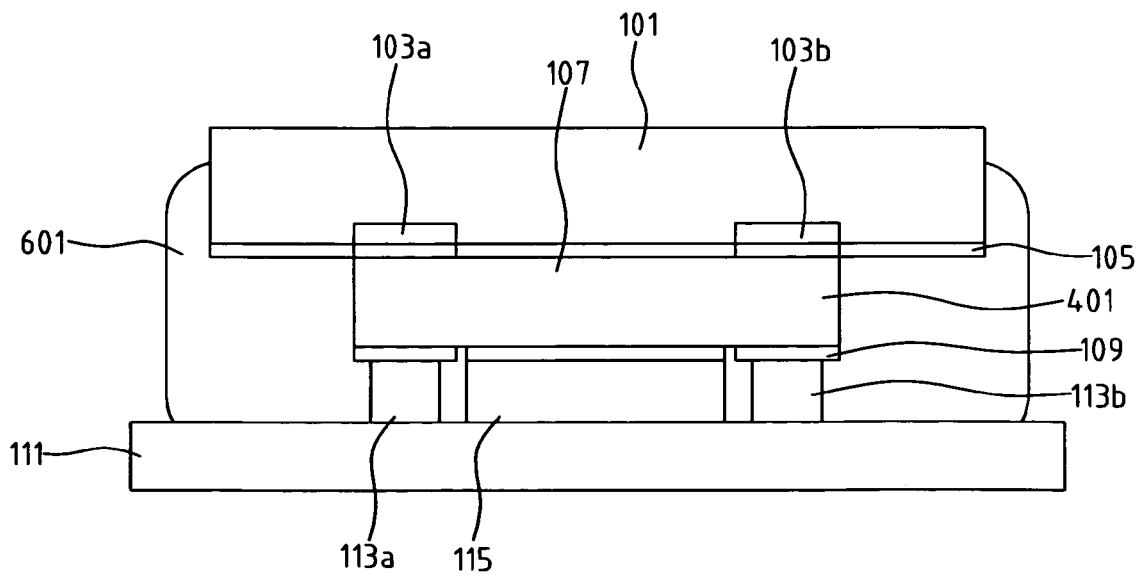

Referring to the upper and the lower figures of FIG. 4, the first metal layer 109 is bonded directly to electrodes 113a and 113b and the bonding layer 115. FIGS. 6a and 6b show respectively cross-sectional views of the bonding structure without and with under-fill after bonding the structures shown in the upper and the lower figures of FIG. 3. Label 601 in FIG. 6b shows the under-fill region.

To increase the reliability of the bonding structure, under-fill can be further applied after bonding.

Figure 7A:
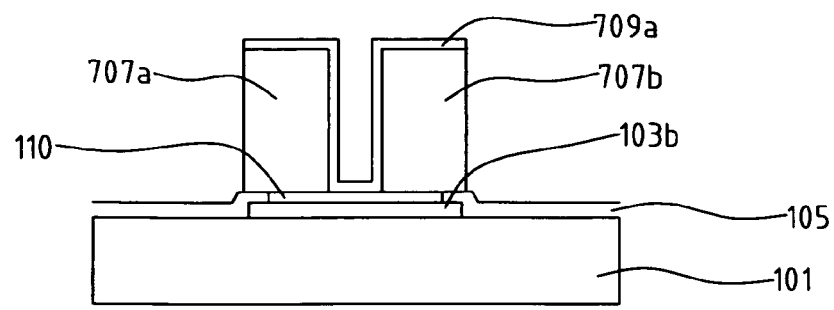
FIGS. 7a~7c show A-B cross-sectional views of FIG. 2 to illustrate three different kinds of structures for the electric connection between the first adhesive metal layer and the first metal layer in the upper figure of FIG. 1.
Figure 7B:
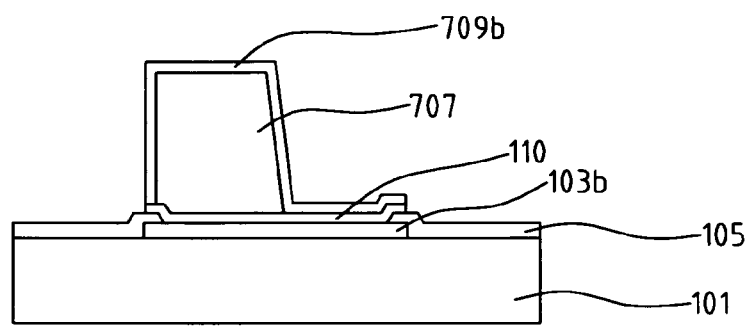
Figure 7C:
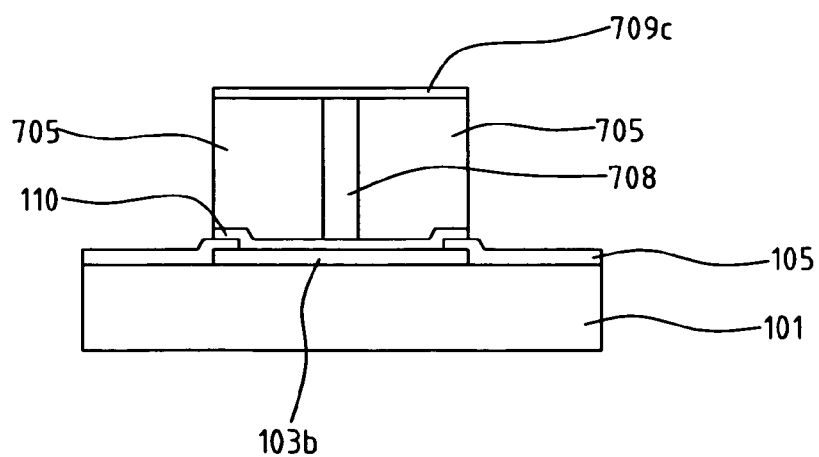

For the structure illustrated in the upper figure of FIG. 1 and FIG. 4, the electric connection between the first adhesive metal layer and the first metal layer can have various structures to implement. FIGS. 7a~7c show A-B cross-sectional views of FIG. 2 to illustrate three different kind of structures for the electric connection between the first adhesive metal layer and the first metal layer shown in the upper figure of FIG. 1.

Referring to FIG. 7a, the buffer layer on the first adhesive metal layer 110 and the metal pad 103b is separated, as shown in labels 707a and 707b. The metal layer 709a covers directly on the separated buffer layer 707a and 707b, as well as on the first adhesive metal layer 110 located between buffer layer 707a and 707b. Referring to FIG. 7b, the metal layer 709b covers directly on and around the buffer layer 707, and contacts with the first adhesive metal layer 110. The size of the contact area depends on the design. Referring to FIG. 7c, an electroplating metal is electroplated to fill the hollow, as shown in label 708, made by the separated buffer layer 705. Then a metal layer 709c is sputtered on the electroplating metal 708 and the buffer layer 705. This forms electric conduct among the metal layer 709c, the electroplating metal 708 and the first adhesive metal layer 110. The electroplating metal 708 and the metal layer 709*c* can use two different metals or the same metal.

Figure 8A:
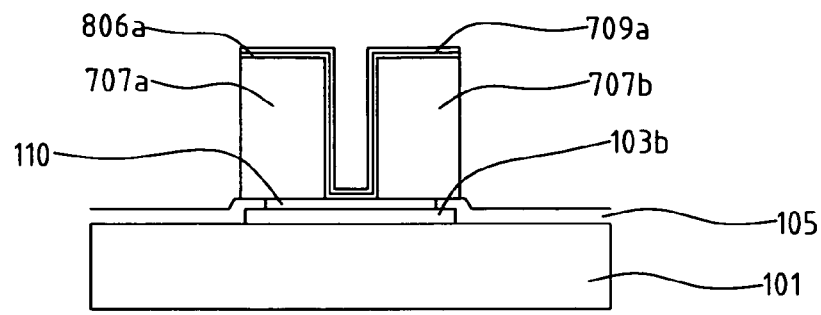
FIGS. 8a~8c show the modified structures of electric connection corresponding to FIGS. 7a~7c.
Figure 8B:
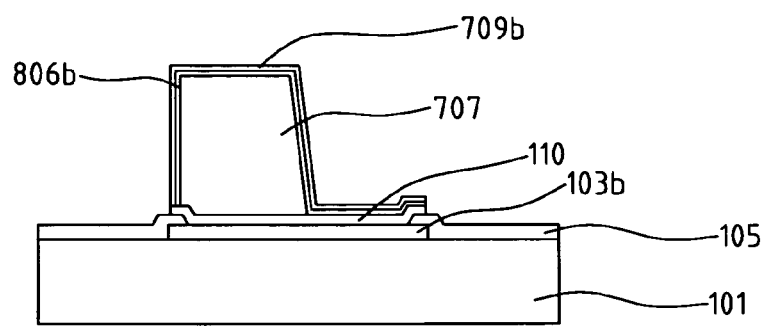
Figure 8C:
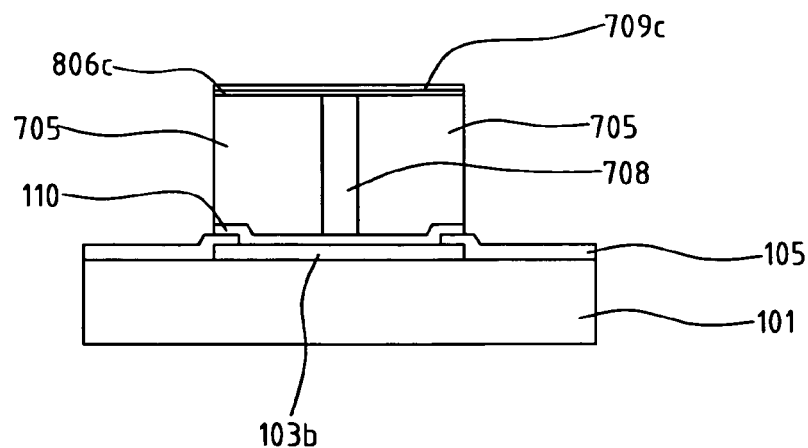

The structure of electric connection shown in each of FIGS. 7*a*~7*c* can also have different variations by adding an adhesive layer between the metal layer and the buffer layer. FIGS. 8*a*~8*c* show the modified structures of electric connection corresponding to FIGS. 7*a*–7*c*. Labels 806*a*~806*c* are respectively their corresponding added adhesive layers.

Figure 9A:
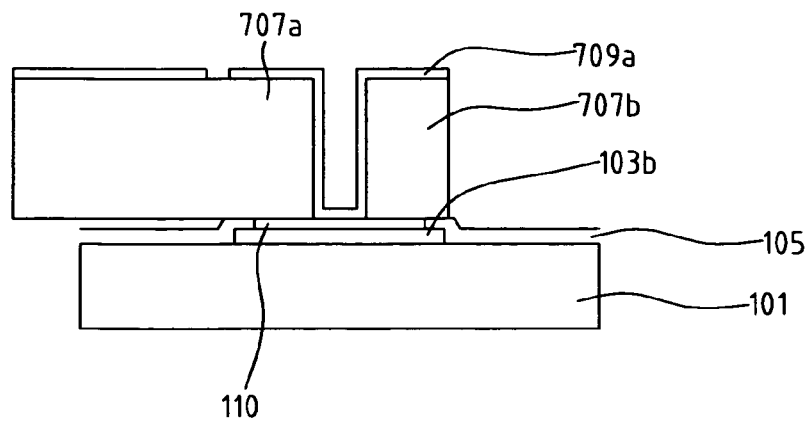
FIGS. 9a~9c show A-B cross-sectional views of FIG. 5 to illustrate three different kinds of structures for the electric connection between the first adhesive metal layer and the first metal layer in the upper figure of FIG. 4.
Figure 9B:
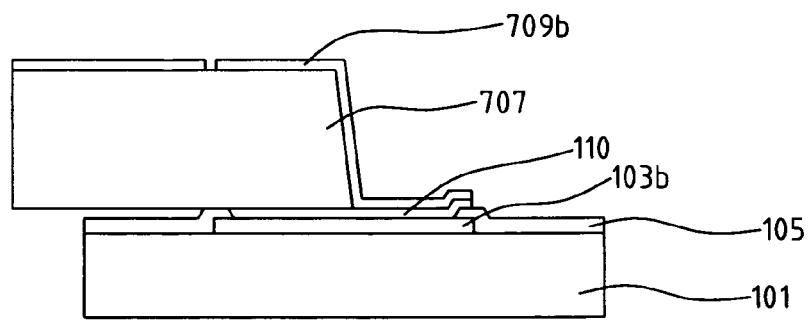
Figure 9C:
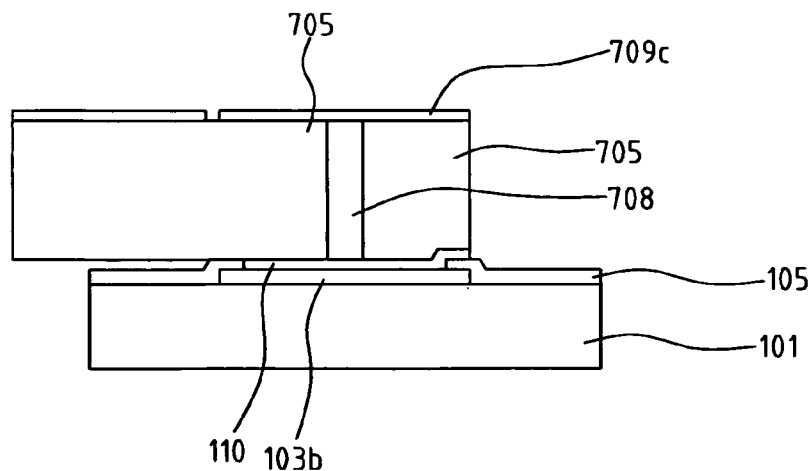
Figure 10A:
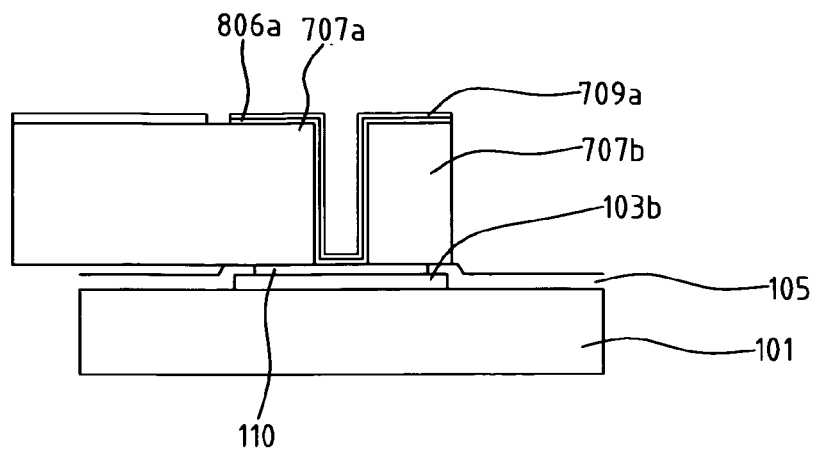
FIGS. 10a~10c show the modified structures of electric connection corresponding to FIGS. 9a~9c.
Figure 10B:
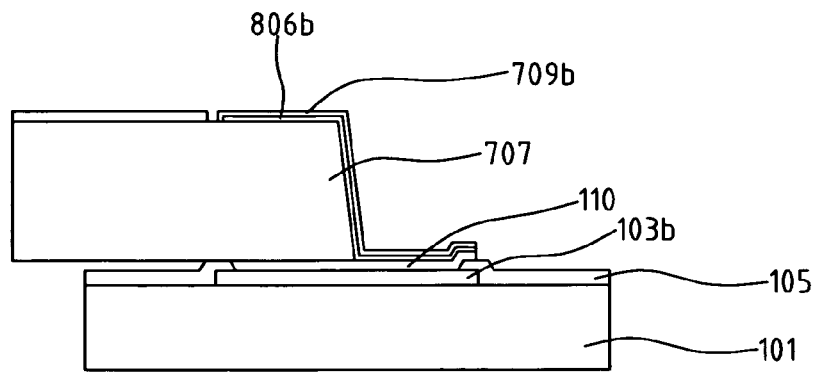
Figure 10C:
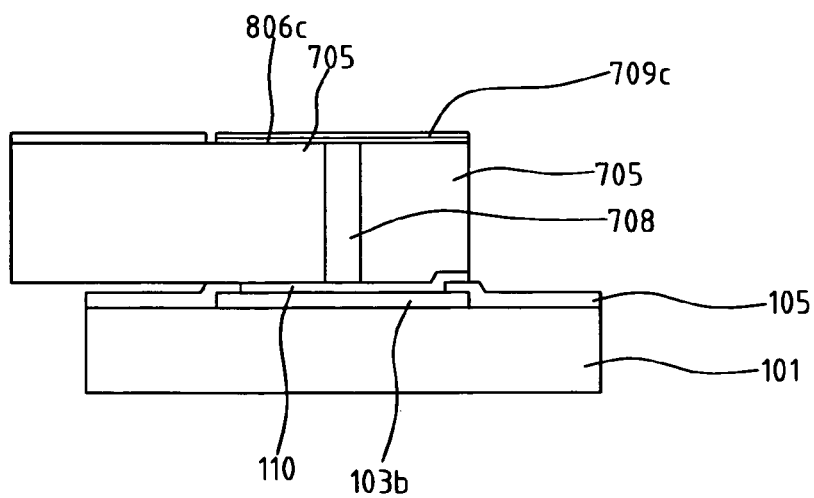

Similarly, for the structure in the upper figure of FIG. 4, the electric connection between the first adhesive metal layer and the first metal layer can be implemented as three different kinds of structures shown in FIGS. 7*a*~7*c*. Also, it can further be designed to have the same modification as shown in FIGS. 8*a*~8*c*. FIGS. 9*a*~9*c* show A-B cross-sectional-views of FIG. 5 to illustrate three different kinds of structures for the electric connection between the first adhesive metal layer and the first metal layer shown in the upper figure of FIG. 4. The same description is not provided herein. FIGS. 10*a*~10*c* show the modified structures of electric connection corresponding to FIGS. 9*a*~9*c*. The same description is not provided herein either.

Figure 11A:
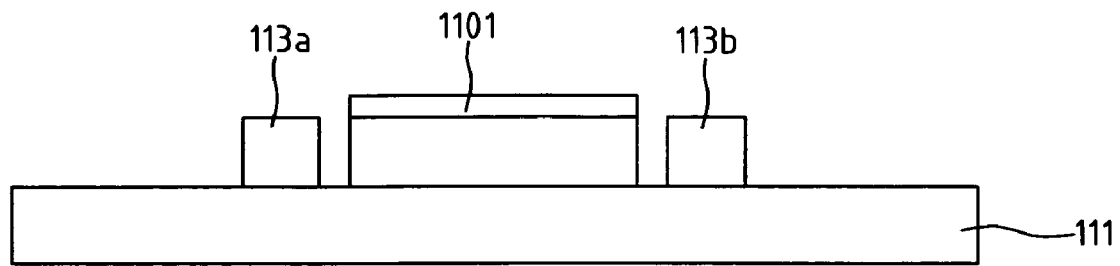
FIGS. 11a and 11b show two different embodiments of covering a second metal layer on the top of electrodes and the bonding layer above the second substrate.
Figure 11B:
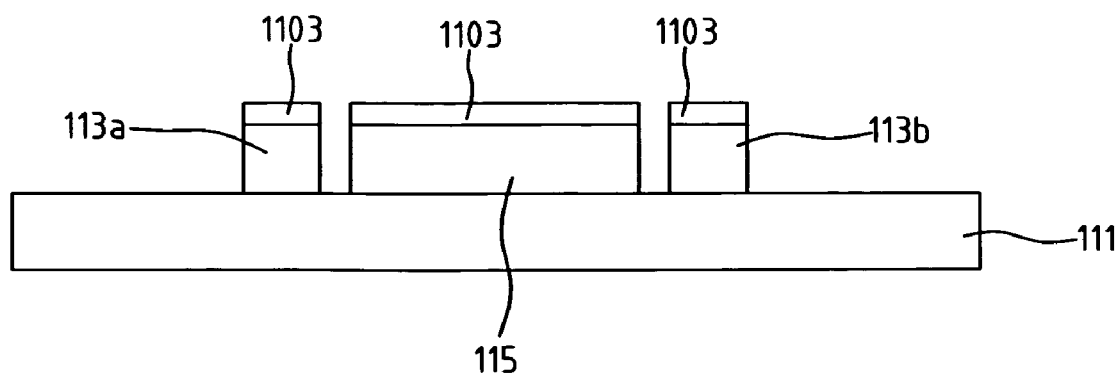

According to this invention, the top of electrodes 113*a* and 113*b* and the bonding layer 115 above the second substrate 111 can further be covered by a second metal layer in the structure of the lower figure of FIG. 1 and FIG. 4. FIGS. 101*a* and 11*b* show two different embodiments. In FIG. 11*a*, a second metal layer 1101 is covered on the bonding layer 115. In FIG. 11*b*, a second metal layer 1103 is covered on electrodes 113*a* and 113*b* as well as the bonding layer 115.

In the structure before bonding, when the outmost layers of the first substrate and the second substrate are metal layers, covalent bonds will limit free electrons of metal because of the metal oxide formed on the surfaces of metal layers. Therefore, it is hard to form metal bonds between two bonding surfaces. Also, the electrical conductivity comes from tunnel-through effect that generates higher contact impedance. Therefore, direct bonding of the present invention can be performed through surface activation. It removes oxide contaminants on the surfaces of metal layers, i.e., removes covalent bonds on the surfaces, and controls the junction gap and the energy distribution by compensating flatness of bonding surfaces. Then it can form metal bonds between two bonding surfaces and accomplishes the bonding.

Figure 12:
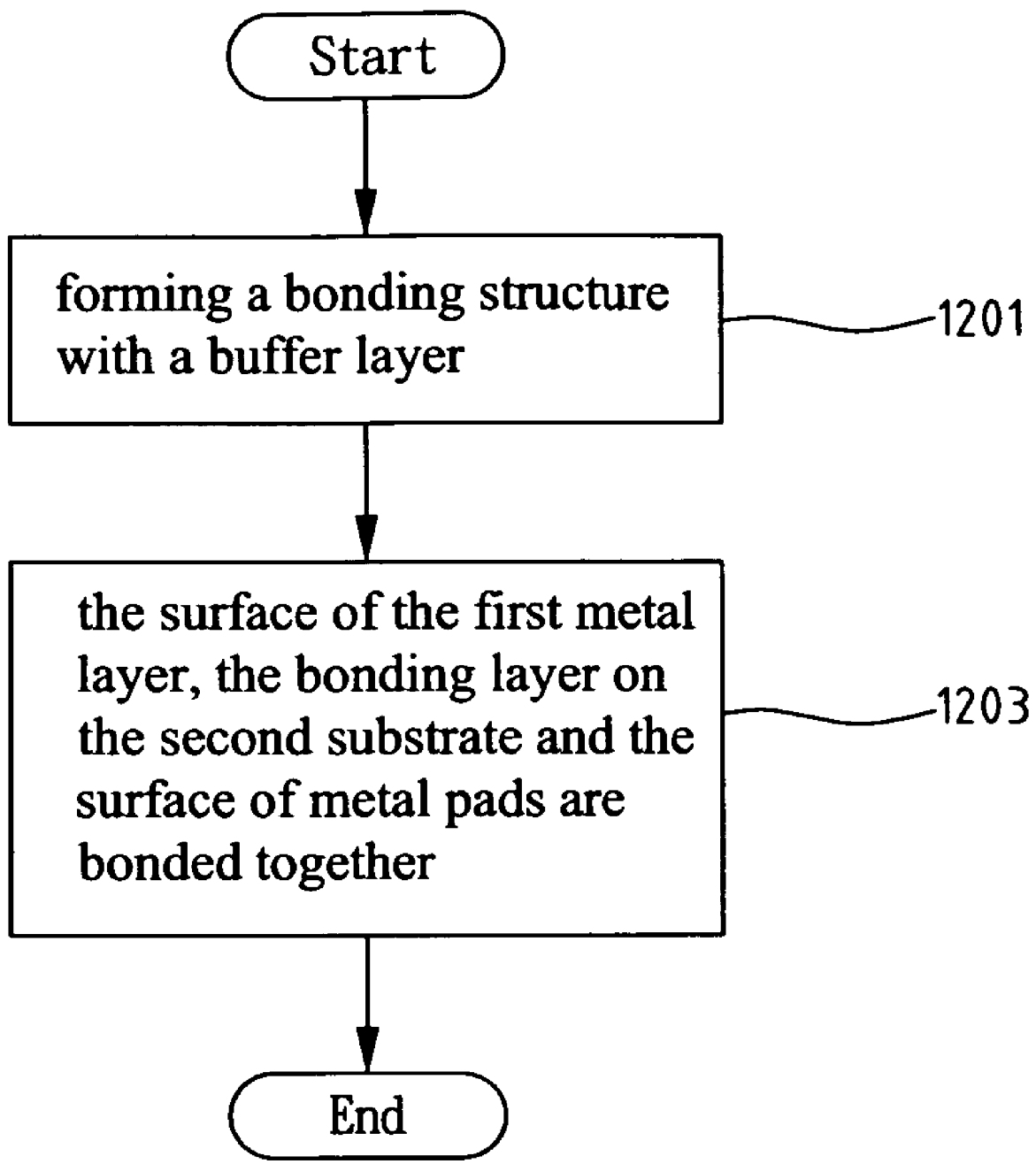
FIG. 12 shows the bonding process of the present invention.

Using the bonding structure of the present invention, the bonding process uses fewer steps and is more reliable than the conventional surface activation method. FIG. 12 shows the bonding process of the present invention. As shown in block 1201, a bonding structure with a buffer layer of the invention is formed first. It includes providing a first substrate with metal pads thereon, covering a protection layer, forming a first adhesive metal layer, coating a buffer layer, covering a first metal layer, and providing a second substrate with electrodes and an independently distributed bonding layer thereon. Then the surface of the first metal layer, the bonding layer on the second substrate and the surface of metal pads are bonded together, as shown in block 1203.

As mentioned before, the bonding method may use direct bonding or adds further under-fill to increase reliability. Direct bonding can be performed through surface activation, surface activation plus heat pressure, or heat pressure only. Surface activation can be done by bombarding using physical property of plasma, exposing to ultraviolet ray, or cleaning with chemical compound to remove particles and oxide contaminants on the surfaces of first metal layer, bonding layer and electrodes. After bonding, the bonding junction will vanish. Therefore, this perfect surface activation bonding process has excellent electric characteristic.

The bonding method of the invention uses mainly the innovative bonding structure of the invention, i.e., using a buffer layer and combining Au—Au diffusion bonding technology to perform direct bonding with surfaces. The method uses fewer steps and is more reliable. After bonding, the bonding junction will vanish. Therefore, this perfect surface activation bonding process has excellent electric characteristic.

Figure 13:
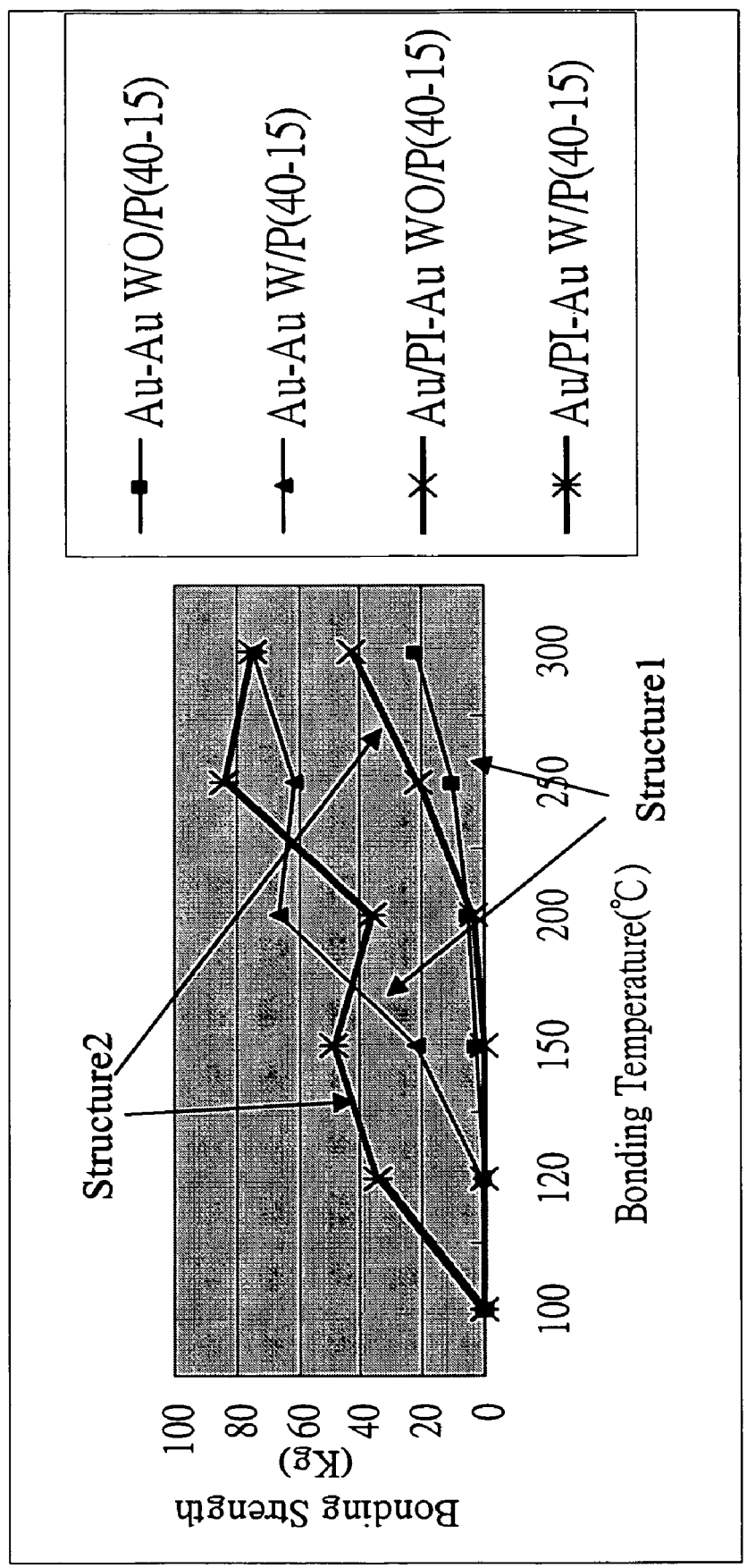
FIG. 13 shows curves of experimental results of direct bonding with and without a buffer layer, the horizontal axis shows the bonding temperature while the vertical axis shows the bonding strength.

FIG. 13 shows curves of experimental results of direct bonding with and without a buffer layer. The horizontal axis shows the bonding temperature in unit ° C. while the vertical axis shows the bonding strength in unit Kg. The two curves indicated by the structure 2, which is the structure with a buffer layer, respectively illustrate bonding results by directly applying 40 Kgf-13.3 Mpa heat pressure after performing surface activation and without performing surface activation. On the other hand, the two curves indicated by the structure 1, which is the structure without a buffer layer, respectively illustrate bonding results by directly applying 40 Kgf-13.3 Mpa heat pressure after performing surface activation and without performing surface activation.

With analysis to the two curves without performing surface activation, when the bonding temperature is greater than 200° C., the bonding strength becomes stronger as the bonding temperature increases. Also, the bonding strength of the structure 2 is stronger than that of the structure 1. When the bonding temperature is below 150° C., with analysis to the two curves with performing surface activation, the bonding strength becomes stronger as the bonding temperature increases. Also, the bonding strength of the structure 2 is stronger than that of the structure 1. Therefore, the bonding structure with a buffer layer of the present invention has stronger bonding strength even at low temperature. It can perform surface activation or direct bonding with heat pressure.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A bonding structure with a buffer layer, comprising:
    a first substrate;
    a plurality of metal pads on a surface of said first substrate;
    a protection layer covering on said surface of said first substrate;
    a first adhesive metal layer being formed on said plurality of metal pads;
    a buffer layer being coated on said protection layer and said first adhesive metal layer;
    a first metal layer covering said buffer layer, said first metal layer being independently distributed on surface areas of said buffer layer opposite to said protection layer and said first adhesive metal layer;
    a second substrate having a plurality of electrodes thereon; and
    a bonding layer, said bonding layer and said plurality of electrodes being independently distributed on said second substrate;

wherein said first metal layer, said plurality of electrodes and said bonding layer are bonded to complete said bonding structure.

2. The bonding structure as claimed in claim 1, wherein said first metal layer, said plurality of electrodes and said bonding layer are bonded by direct bonding.

3. The bonding structure as claimed in claim 1, wherein said plurality of electrodes on said second substrate are respectively aligned to said plurality of metal pads on said surface of said first substrate.

4. The bonding structure as claimed in claim 3, wherein a second metal layer is formed on said bonding layer located on said second substrate.

5. The bonding structure as claimed in claim 3, wherein a second metal layer is formed on said plurality of electrodes and on said bonding layer located on said second substrate.

6. The bonding structure as claimed in claim 1, wherein said buffer layer coated on said first adhesive metal layer over said plurality of metal pads and said buffer layer on said protection layer are independently distributed.

7. The bonding structure as claimed in claim 6, wherein a second metal layer is formed on said bonding layer located on said second substrate.

8. The bonding structure as claimed in claim 6, wherein a second metal layer is formed on said plurality of electrodes and on said bonding layer located on said second substrate.

9. The bonding structure as claimed in claim 1, wherein said buffer layer coated on said first adhesive metal layer over said plurality of metal pads and said buffer layer on said protection layer are connected.

10. The bonding structure as claimed in claim 1, wherein said first substrate is a silicon substrate.

11. The bonding structure as claimed in claim 1, wherein said second substrate is one of glass substrate, polymer substrate, silicon substrate or ceramic substrate.

12. The bonding structure as claimed in claim 1, wherein the material for said first metal layer is chosen from one of gold, aluminum or copper.

13. The bonding structure as claimed in claim 1, wherein the material for said buffer layer is polymer.

14. The bonding structure as claimed in claim 1, wherein under-fill is further applied between said first substrate and said second substrate to increase the reliability of said bonding structure.

* * * * *